(12) United States Patent
Zhao

(10) Patent No.: US 10,985,276 B2
(45) Date of Patent: Apr. 20, 2021

(54) METHOD AND DEVICE HAVING LOW CONTACT RESISTANCE

(71) Applicants: Semiconductor Manufacturing International (Shanghai) Corporation, Shanghai (CN); Semiconductor Manufacturing International (Beijing) Corporation, Beijing (CN)

(72) Inventor: Meng Zhao, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/559,342

(22) Filed: Sep. 3, 2019

(65) Prior Publication Data
US 2019/0393349 A1 Dec. 26, 2019

Related U.S. Application Data

(62) Division of application No. 15/935,888, filed on Mar. 26, 2018, now Pat. No. 10,446,684.

(30) Foreign Application Priority Data

May 19, 2017 (CN) .......................... 201710355767.X

(51) Int. Cl.
*H01L 29/78* (2006.01)
*H01L 29/45* (2006.01)
(Continued)

(52) U.S. Cl.
CPC ...... *H01L 29/7848* (2013.01); *H01L 21/0245* (2013.01); *H01L 21/02381* (2013.01);
(Continued)

(58) Field of Classification Search
CPC .................................................. H01L 29/7848
See application file for complete search history.

(56) References Cited

U.S. PATENT DOCUMENTS 10,446,684 B2 10/2019 Zhao
2003/0234422 A1 12/2003 Wang et al.
(Continued)

FOREIGN PATENT DOCUMENTS

| CN | 102487009 A | 6/2012 |
| CN | 104217953 A | 12/2014 |
| CN | 104701164 A | 6/2015 |

OTHER PUBLICATIONS

U.S. Appl. No. 15/935,888, Non Final Office Action, dated Dec. 13, 2018, 13 pages.

*Primary Examiner* — Walter H Swanson
(74) *Attorney, Agent, or Firm* — Anova Law Group, PLLC

(57) ABSTRACT

A method for manufacturing a semiconductor device includes providing a semiconductor structure having a semiconductor substrate and a gate structure on the semiconductor substrate. The gate structure includes a gate dielectric layer on the semiconductor substrate, a gate on the gate dielectric layer, and a spacer layer on opposite sides of the gate. The method also includes etching the semiconductor substrate to form first and second recesses, etching a portion of the spacer layer to expose a surface portion of the semiconductor substrate, and forming a source filling the first recess and a drain filling the second recess. The source (drain) includes a first source (drain) portion in the first (second) recess and a second source (drain) portion on the first source (drain) portion. The second source portion or the second drain portion covers the exposed surface portion of the semiconductor substrate.

15 Claims, 8 Drawing Sheets

(51) Int. Cl.

|  |  |
|---|---|
| *H01L 29/08* | (2006.01) |
| *H01L 29/66* | (2006.01) |
| *H01L 21/311* | (2006.01) |
| *H01L 21/265* | (2006.01) |
| *H01L 21/308* | (2006.01) |
| *H01L 21/02* | (2006.01) |
| H01L 29/161 | (2006.01) |
| H01L 29/165 | (2006.01) |

(52) U.S. Cl.
CPC .. *H01L 21/02532* (2013.01); *H01L 21/02639* (2013.01); *H01L 21/26513* (2013.01); *H01L 21/308* (2013.01); *H01L 21/31111* (2013.01); *H01L 29/0847* (2013.01); *H01L 29/456* (2013.01); *H01L 29/6653* (2013.01); *H01L 29/6656* (2013.01); *H01L 29/66636* (2013.01); *H01L 29/785* (2013.01); H01L 21/02645 (2013.01); H01L 21/26506 (2013.01); H01L 29/161 (2013.01); H01L 29/165 (2013.01)

(56) References Cited

U.S. PATENT DOCUMENTS

| 2008/0128806 | A1* | 6/2008 | Liu | H01L 21/26506 |
| | | | | 257/347 |
| 2012/0068193 | A1* | 3/2012 | Chan | H01L 21/26513 |
| | | | | 257/77 |
| 2013/0207166 | A1 | 8/2013 | Chen et al. | |
| 2014/0077264 | A1 | 3/2014 | Chen | |
| 2014/0361339 | A1* | 12/2014 | Liu | H01L 29/7834 |
| | | | | 257/192 |
| 2015/0155381 | A1 | 6/2015 | Song | |
| 2016/0064522 | A1 | 3/2016 | Tu | |

* cited by examiner

METHOD AND DEVICE HAVING LOW CONTACT RESISTANCE

CROSS-REFERENCES TO RELATED APPLICATIONS

The present application is a divisional application of U.S. patent application Ser. No. 15/935,888, filed Mar. 26, 2018, now U.S. Pat. No. 10,446,684, which claims priority to Chinese Patent Application No. 201710355767.X, filed with the State Intellectual Property Office of People's Republic of China on May 19, 2017, the contents of which is incorporated herein by reference in their entirety.

FIELD OF THE DISCLOSURE

The present disclosure relates to the field of semiconductor technology, and more particularly to a semiconductor device having a reduced contact resistance and method for manufacturing the semiconductor device.

BACKGROUND OF THE INVENTION

As the feature size of semiconductor devices decreases, the short-channel effect becomes more pronounced. In order to mitigate the short-channel effect, fin field effect transistors (FinFETs) are used instead of planar transistors. Furthermore, ultra-shallow and abrupt junctions are being used to improve the short-channel effect of core devices.

However, as finFET devices further scale, the FinFET devices may face many problems, in particular, a large contact resistance value between the source/drain and the channel region may reduce the channel current. Furthermore, the source, drain or halo doping of FinFET devices may cause a portion of dopants to diffuse into the channel region, resulting in an undesired doping of the channel region, which will reduce the current in the channel region and the carrier mobility and increase the leakage current of the FinFET devices.

BRIEF SUMMARY OF THE INVENTION

Embodiments of the present invention provides a novel solution to reduce the contact resistance between a source and a channel region or between a drain and the channel region of a FinFET device.

In accordance with an embodiment of the present invention, a method for manufacturing a semiconductor device is provided. The method may include providing a semiconductor structure including a semiconductor substrate and a gate structure on the semiconductor substrate. The gate structure includes a gate dielectric layer on the semiconductor substrate, a gate on the gate dielectric layer, and a spacer layer on opposite sides of the gate. The method also may include etching the semiconductor substrate to form a first recess and a second recess on opposite sides of the gate structure, etching a portion of a sidewall of the spacer layer on at least one side of the gate to expose a surface portion of the semiconductor substrate, and forming a source filling the first recess and forming a drain filling the second recess, the source comprising a first source portion in the first recess and a second source portion on the first source portion, the drain comprising a first drain portion in the second recess and a second drain portion on the first drain portion, wherein the second source portion or the second drain portion covers at least a portion of the exposed surface portion of the semiconductor substrate.

In one embodiment, etching the portion of the sidewall of the spacer layer may include etching a lower portion of the spacer layer on the opposite sides of the gate to expose a first surface portion of the semiconductor substrate and a second surface portion of the semiconductor substrate, the first surface portion being adjacent to the first recess, and the second surface portion being adjacent to the second recess, and forming the source comprises forming the second source portion on the first surface portion, and forming the drain comprises forming the second drain portion on the second surface portion.

In one embodiment, etching the portion of the sidewall of the spacer layer includes removing a thickness of the sidewall of the spacer layer to expose a surface portion of the semiconductor substrate.

In one embodiment, etching the portion of the sidewall of the spacer layer includes forming a notch in a lower portion of the spacer layer, the notch exposing the surface portion of the semiconductor substrate.

In one embodiment, the second source portion has a doping concentration greater than a doping concentration of the first source portion, and the second drain portion has a doping concentration greater than a doping concentration of the first drain portion.

In one embodiment, the first source portion and the first drain portion each include silicon germanium, silicon carbide, or silicon phosphide, and the second source portion and the second drain portion each include silicon.

In one embodiment, the method may further include, prior to forming the source and forming the drain, forming a seed layer in the first recess and in the second recess.

In one embodiment, the seed layer, the first source portion, and the first drain portion each include silicon germanium, and the first source portion and the first drain portion each include a germanium concentration that is greater than a germanium concentration of the seed layer.

In one embodiment, the method may further include, after forming the first source portion and the first drain portion and prior to forming the second source portion and the second drain portion, performing an implantation of carbon, fluorine, and/or nitrogen in the first source portion and the first drain portion.

In one embodiment, the method may further include, after forming the source and forming the drain, performing an implantation of carbon, fluorine, and/or nitrogen on the source and the drain. In one embodiment, the carbon, fluorine, and/or nitrogen are implanted in the source and the drain at a depth in a range between 1 nm and 20 nm and a concentration in a range between $1\times10^{19}$ atoms/cm$^3$ and $5\times10^{20}$ atoms/cm$^3$.

Embodiments of the present invention also provide a semiconductor device. The semiconductor device includes a semiconductor substrate, a gate structure on the semiconductor substrate and comprising a gate dielectric layer, a gate on the gate dielectric layer, a spacer layer on opposite sides of the gate, a first recess and a second recess in the semiconductor substrate and on opposite sides of the gate structure, a source filling the first recess and including a first source portion in the first recess and a second source portion on the first source portion, and a drain filing the second recess and including a first drain portion in the second recess and a second drain portion on the first drain portion. A surface portion of the semiconductor substrate is exposed between the spacer layer and the first recess or between the spacer layer and the second recess, and the second source portion or the second drain portion covers the exposed surface portion of the semiconductor substrate.

In one embodiment, the surface portion of the semiconductor substrate includes a first surface portion between the first recess and the spacer layer and covered by the second source portion, and a second surface portion between the second recess and the spacer layer and covered by the second drain portion.

In one embodiment, the semiconductor device may further include a notch at a lower portion of the spacer layer. The notch exposes the surface portion of the semiconductor substrate.

In one embodiment, the second source portion has a doping concentration greater than a doping concentration of the first source portion, and the second drain portion has a doping concentration greater than a doping concentration of the first drain portion.

In one embodiment, the first source portion and the first drain portion each include silicon germanium, silicon carbide, or silicon phosphide. The second source portion and the second drain portion each include silicon.

In one embodiment, the semiconductor device may also include a seed layer in the first recess and the second recess, wherein the first source portion and the first drain portion are on the seed layer. In one embodiment, the seed layer, the first source portion, and the first drain portion each include silicon germanium, and the first source portion and the first drain portion each include a germanium concentration that is greater than a germanium concentration of the seed layer.

In one embodiment, the first source portion and the first drain portion each include carbon, fluorine, and/or nitrogen.

In one embodiment, the source and the drain each include carbon, fluorine, and/or nitrogen.

In one embodiment, the carbon, fluorine, and/or nitrogen are implanted in the source and the drain at a depth in a range between 1 nm and 20 nm and a concentration in a range between $1\times10^{19}$ atoms/cm$^3$ and $5\times10^{20}$ atoms/cm$^3$.

The following detailed description together with the accompanying drawings will provide a better understanding of the nature and advantages of the present disclosure.

BRIEF DESCRIPTION OF THE DRAWINGS

The accompanying drawings, referred to herein and constituting a part hereof, illustrate embodiments of the invention. The drawings together with the description serve to explain the principles of the invention.

DETAILED DESCRIPTION OF THE INVENTION

Figure 1:
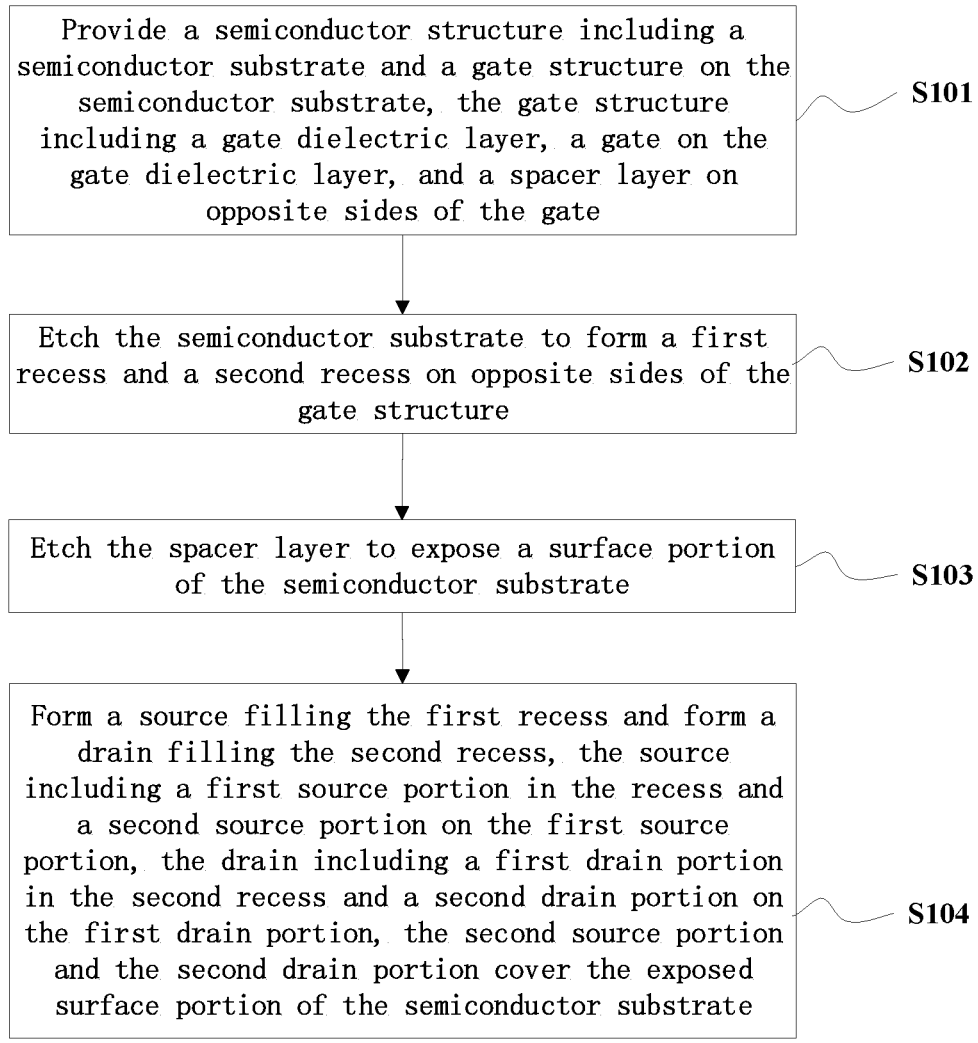
FIG. 1 is a simplified flowchart of a method for manufacturing a semiconductor device according to one embodiment of the present invention.

Embodiments of the present disclosure now will be described more fully hereinafter with reference to the accompanying drawings. The disclosure may, however, be embodied in many different forms and should not be construed as limited to the embodiments set forth herein. Rather, these embodiments are provided so that this disclosure will be thorough and complete, and will fully convey the scope of the disclosure to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the disclosure. As used herein, the singular forms "a" "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

As used herein, the terms "example embodiment," "exemplary embodiment," and "present embodiment" do not necessarily refer to a single embodiment, although it may, and various example embodiments may be readily combined and interchanged, without departing from the scope or spirit of the present invention. Furthermore, the terminology as used herein is for the purpose of describing example embodiments only and is not intended to be a limitation of the invention. In this respect, as used herein, the term "in" may include "in" and "on", and the terms "a", "an" and "the" may include singular and plural references.

Embodiments of the disclosure are described herein with reference to cross-sectional illustrations that are schematic illustrations of idealized embodiments (and intermediate structures) of the disclosure. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the disclosure.

Embodiments of the present disclosure now will be described more fully hereinafter with reference to the accompanying drawings, in which embodiments of the disclosure are shown. This disclosure may, however, be embodied in many different forms and should not be construed as limited to the embodiments set forth herein.

It is noted that the reference numerals and letters denote similar items in the accompanying drawings. Thus, once an item is defined or illustrated in a drawing, it will not be further described in subsequent drawings.

FIG. 1 is a flowchart of a method for manufacturing a semiconductor device according to an embodiment of the present disclosure. The method may include the following steps:

Step S101: providing a semiconductor substrate. The semiconductor substrate includes a semiconductor substrate and a gate structure on the semiconductor substrate. The gate structure includes a gate dielectric layer on the semiconductor substrate, a gate on the gate dielectric layer, a spacer layer on sidewalls on opposite sides of the gate.

Step S102: etching the semiconductor substrate to form a first recess and a second recess on opposite sides of the gate structure, respectively.

Step S103: etching a portion of the spacer layer to expose at least a portion of the semiconductor substrate.

In one embodiment, in step S103 the portion of the spacer layer on the sidewalls of the gate is etched to expose a first surface portion and a second surface portion of the semiconductor substrate that are on the respective opposite sides of the gate structure.

Step S104: forming a source filling the first recess and a drain filling the second recess. The source includes a first source portion in the first recess and a second source portion on the first source portion. The drain includes a first drain portion in the second recess and a second drain portion on the first drain portion. At least one of the second source portion and the second drain portion covers at least a portion of the exposed surface portion of the semiconductor substrate. For example, when forming the source and drain, the second source portion covers the first surface portion and the second drain portion covers the second surface portion of the semiconductor substrate.

The above-described steps provides a method of manufacturing a semiconductor device. In the method, a portion of the spacer layer on the sidewalls of the gate is etched to expose at least a portion of the semiconductor substrate. Then, when forming the source and drain, at least one of the second source portion of the source and the second drain portion of the drain covers at least the exposed portion of the semiconductor substrate, so as to increase the contact area between the source or the drain and the channel region in the semiconductor substrate between the source and drain, thereby reducing the contact resistance and increasing the channel current in the operation of the semiconductor device, so that the performance of the semiconductor device is improved.

FIGS. 2 to 7 are cross-sectional views illustrating intermediate stages in the process of forming a semiconductor device according to an embodiment of the present invention. The manufacturing process of a semiconductor device according to one embodiment of the present invention will be described below with reference to FIGS. 2 to 7.

Figure 2:
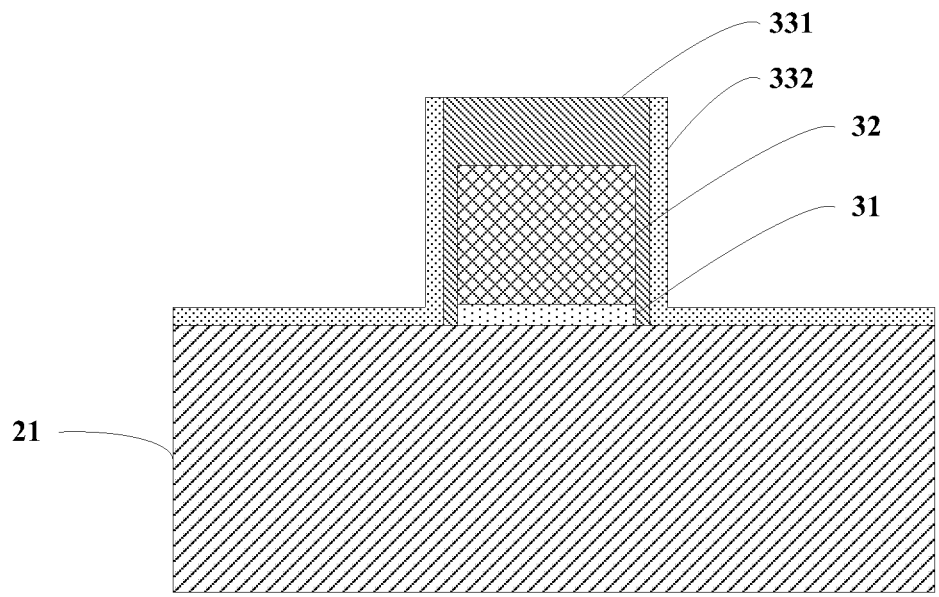
FIG. 2 is a cross-sectional view illustrating an initial structure in the process of forming a semiconductor device according to one embodiment of the present invention.

Referring to FIG. 2, an initial structure is provided. The initial structure may include a semiconductor substrate (e.g., a silicon substrate) 21, a gate dielectric layer 31 on the semiconductor substrate 21, a gate 32 on the gate dielectric layer 31, and a first spacer 331 on sidewalls of the gate 32, and a second spacer 332 on sidewalls of the first spacer 331. In one embodiment, the first spacer 331 may also be formed on the upper surface of the gate 32, as shown in FIG. 2. In one embodiment, the gate dielectric layer 31 may include silicon dioxide and/or high dielectric constant materials (e.g., hafnium dioxide). In one embodiment, the gate 32 may include polysilicon or metal (e.g., tungsten). In one embodiment, the first spacer 331 may include silicon nitride. In one embodiment, the second spacer 332 may include silicon dioxide or silicon nitride.

In one embodiment, the gate structure may further include a work function adjusting layer (not shown) between the gate dielectric layer 31 and the gate 32. The work function adjusting layer may be used to adjust the threshold voltage of the semiconductor device.

In one embodiment, the step of providing the initial structure may further include doping (e.g., ion implantation) a portion of the semiconductor substrate on opposite sides of the gate to form a lightly doped drain (LDD) region.

In one embodiment, the step of providing the initial structure may further include forming a trench isolation, e.g., a shallow trench isolation (STI) (not shown) surrounding the semiconductor substrate.

Figure 3:
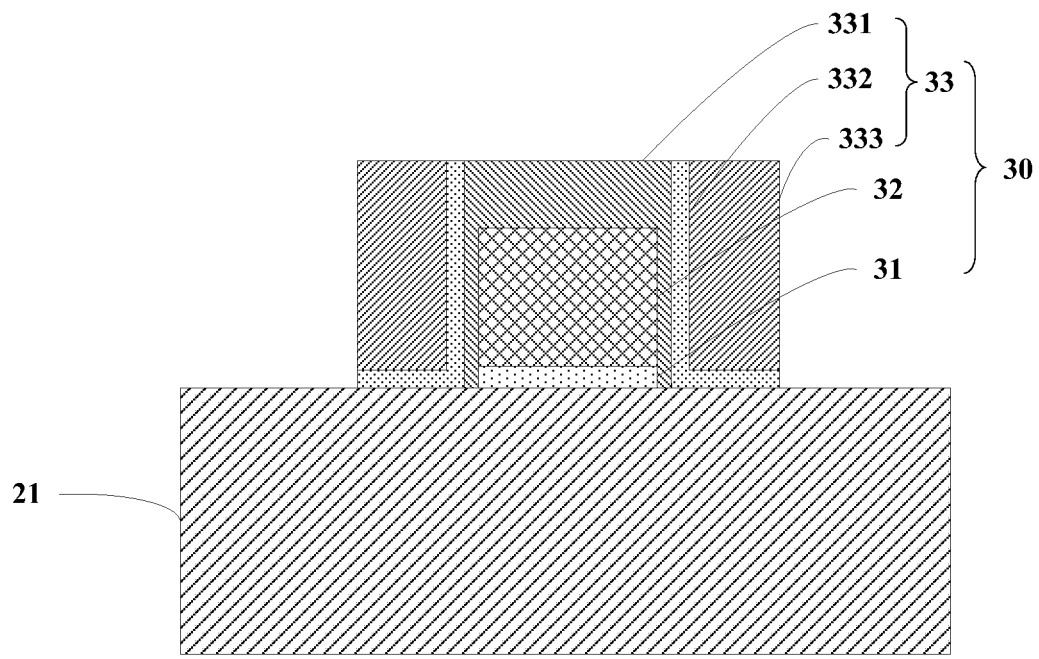
FIG. 3 is a cross-sectional view illustrating an intermediate stage in the process of forming a semiconductor device after forming a third spacer layer according to one embodiment of the present invention.

Next, referring to FIG. 3, a third spacer layer 333 is formed on the second spacer layer 332. The third spacer layer 333 may include silicon nitride. An etch process is carried out on the second spacer layer 332 and the third spacer layer 333 to form a spacer layer 33. That is, the first spacer layer 331, the second spacer layer 332, and the third spacer layer 333 are collectively referred to as the spacer layer 33.

Thus, a semiconductor structure is formed. Referring to FIG. 3, the semiconductor structure may include a semiconductor substrate 21 and a gate structure 30 on the semiconductor substrate 21. The gate structure 30 may include a gate dielectric layer 31 on the semiconductor substrate 21, a gate 32 on the gate dielectric layer 31, and a spacer layer 33 on opposite sides of the gate 32. The spacer layer 33 may include a first spacer layer 331 on sidewalls of the opposite sides of the gate 32, a second spacer layer 332 on the sidewalls of the first spacer layer 331, and the third spacer layer 333 on the second spacer layer 332. In one embodiment, the first spacer layer 331 may also be formed on the upper surface of the gate 32, as shown in FIG. 3.

Figure 4:
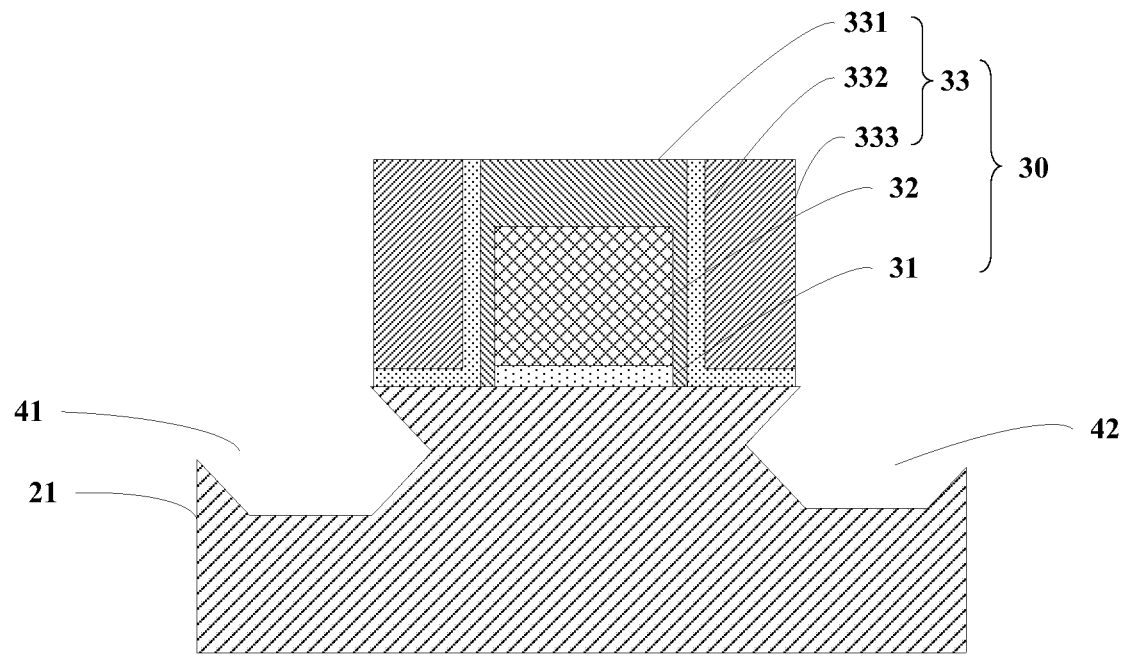
FIG. 4 is a cross-sectional view illustrating an intermediate stage in the process of forming a semiconductor device after forming recesses according to one embodiment of the present invention.

Next, referring to FIG. 4, the semiconductor substrate 21 is etched to form a first recess 41 and a second recess 42 on opposite sides of the gate structure 30, respectively.

Figure 5:
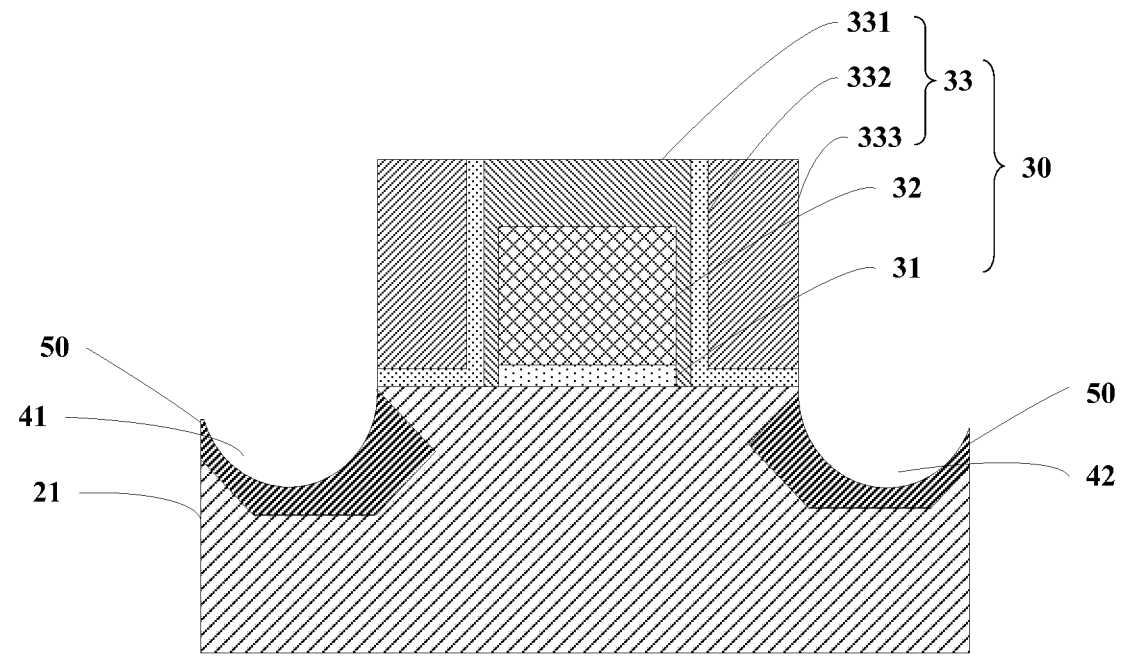
FIG. 5 is a cross-sectional view illustrating an intermediate stage in the process of forming a semiconductor device after forming a seed layer in the recesses according to one embodiment of the present invention.

Next, referring to FIG. 5, a seed layer 50 is formed in the first recess 41 and the second recess 32, e.g., by an epitaxial process. In an exemplary embodiment, the seed layer 50 may include silicon germanium. Of course, one of skill in the art will appreciate that other materials may also be used for the seed layer, and the scope of the present invention is not limited thereto.

Figure 6:
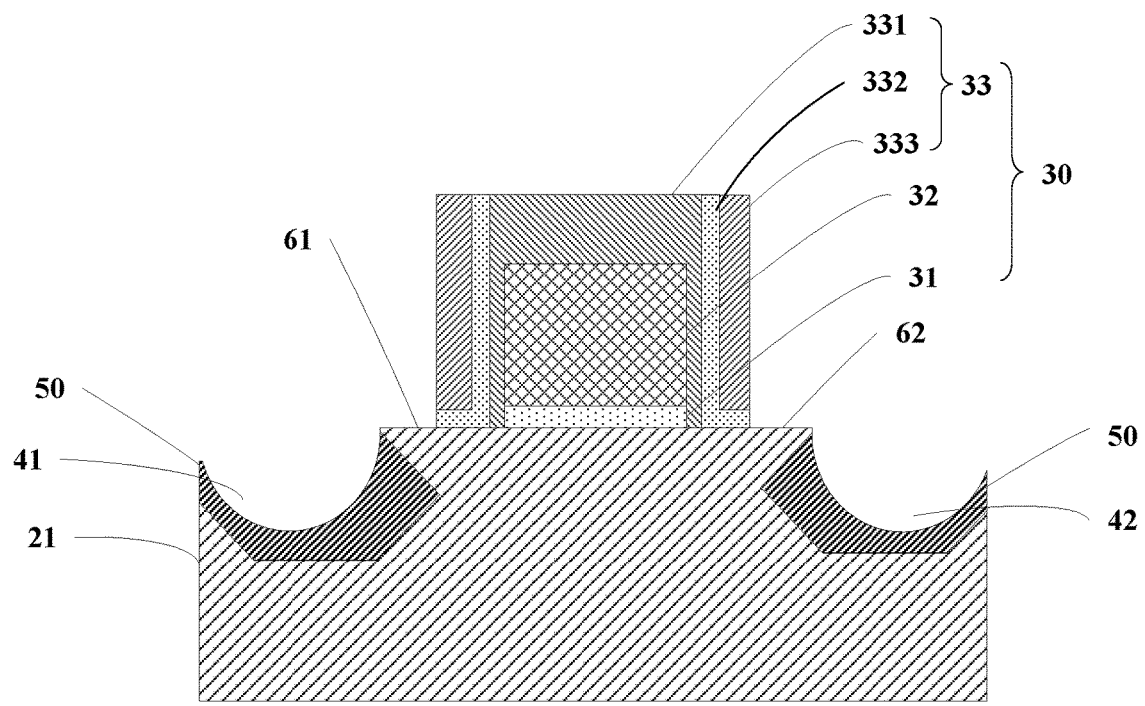
FIG. 6 is a cross-sectional view illustrating an intermediate stage in the process of forming a semiconductor device after thinning the third spacer layer according to one embodiment of the present invention.

Next, referring to FIG. 6, a portion of the spacer layer 33 on the sidewalls of the opposite sides gate electrode 32 is etched to expose a first surface portion 61 and a second surface portion 62 of the semiconductor substrate 21 on the opposite sides of the gate structure 30. It is to be understood that, although the spacer layers on the opposite sides of the gate electrode are etched as shown in FIG. 6, the exposed surface portions of the semiconductor substrate (e.g., the first surface portion 61 and the second surface portion 62) are exposed, the scope of the present invention, however, is not limited to this. For example, only the spacer layer on one side of the gate is etched so that only one surface portion of the semiconductor substrate (e.g., the first surface portion 61 or the second surface portion 62) is exposed. That is, in this step, only a portion of the spacer layer 33 on one sidewall of the gate 32 is etched to expose at least a surface portion of the semiconductor substrate.

In one embodiment, the step of etching the portion of the spacer layer on one side of the gate may include thinning at least one side of the spacer layer using an etching process so that at least one surface portion of the semiconductor substrate 21 is exposed through the thinned spacer layer. In the example embodiment shown in FIG. 6, both sides of the spacer layer are thinned.

Figure 7:
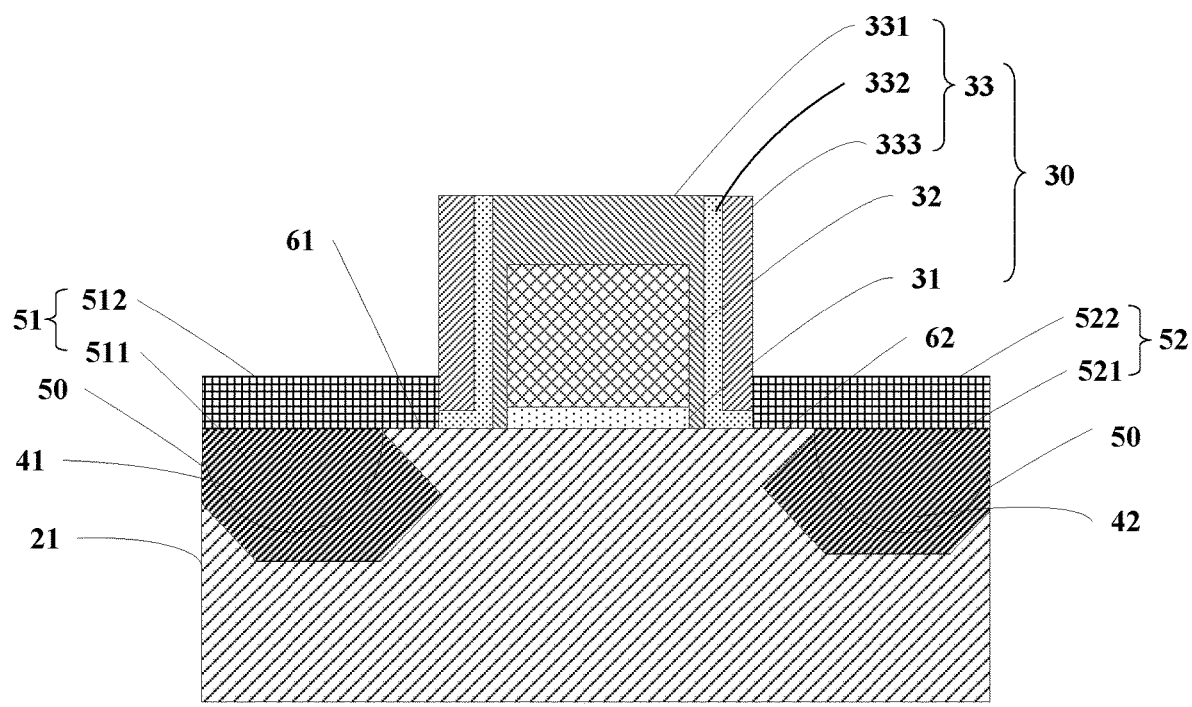
FIG. 7 is a cross-sectional view illustrating an intermediate stage in the process of forming a semiconductor device after forming the source and drain in the recesses according to one embodiment of the present invention.

Next, referring to FIG. 7, a source 51 filling the first recess 41 and a drain 52 filling the second recess 42 are formed, e.g., by an epitaxial process. The source 51 may include a first source portion 511 in the first recess 41 and a second source portion 512 on the first source portion 511. The drain 52 may include a first drain portion 521 in the second recess 42 and a second drain portion 522 on the first drain portion 521. The second source portion 512 may cover the first surface portion 61 of the semiconductor substrate, and the second drain portion 522 may cover the second surface portion 62 of the semiconductor substrate.

In one embodiment, the first source portion 511 and the first drain portion 521 each may include silicon germanium. Silicon germanium can be used especially for PMOS devices. Of course, the scope of the present invention is not limited thereto, and the first source portion 511 and the first drain portion 521 each may also include other materials such as silicon carbide or silicon phosphide. For example, silicon carbide or silicon phosphide cam be used for NMOS devices. In one embodiment, the second source portion 512 and the second drain portion 522 each may include silicon.

In one embodiment, the source 51 includes a dopant of a desired conductivity type (e.g., a P-type or an N-type), and the first source portion 511 and the second source portion 512 each include the same dopant. For example, for a PMOS device, the dopant is a P-type dopant (e.g., boron). For an NMOS device, the dopant is an N-type dopant (e.g., phosphorous or arsenic). In one embodiment, the second source portion 512 has a doping concentration that is greater than the doping concentration of the first source portion 511. The higher doping concentration of the second source portion 512 reduces the contact resistance between the source and the channel region and also the contact resistance between the source and the source contact member (not shown).

In one embodiment, the drain 52 includes a dopant of a desired conductivity type (e.g., a P-type or an N-type), and the first drain portion 521 and the second drain portion 522 each include the same dopant. For example, for a PMOS device, the dopant is a P-type dopant (e.g., boron). For an NMOS device, the dopant is an N-type dopant (e.g., phosphorous or arsenic). In one embodiment, the second drain portion 522 has a doping concentration that is greater than the doping concentration of the first drain portion 521. The higher doping concentration of the second drain portion 522 reduces the contact resistance between the drain and the channel region and also the contact resistance between the drain and the drain contact member (not shown).

Figure 7A:
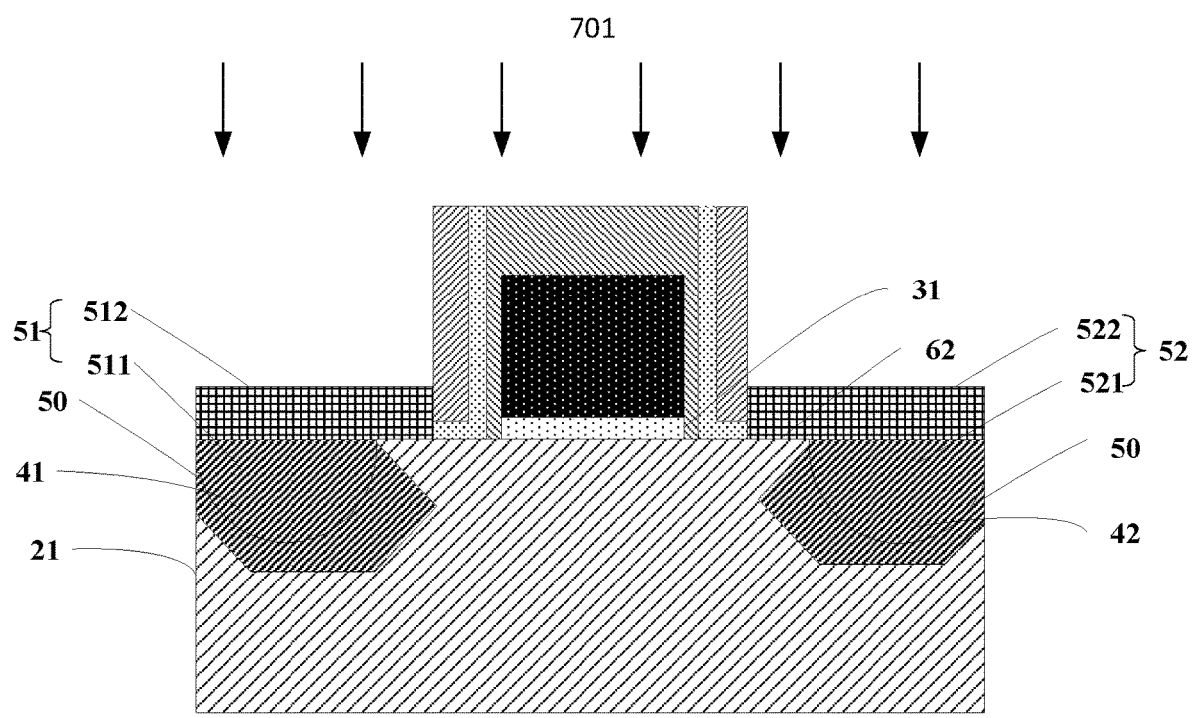
FIG. 7A is a cross-sectional view illustrating an intermediate stage in the process of forming a semiconductor device by performing an implantation into the source and drain in the recesses according to one embodiment of the present invention.

In some embodiments, the step of forming the source and drain may include forming a first source portion 511 on the seed layer 50 filling the first recess 41 and a first drain portion 521 on the seed layer 50 filling the second recess 42 using an epitaxial process, as shown in FIG. 7. In one embodiment, the step of forming the source and drain may further include forming a second source portion 512 on the first source portion 511 and a second drain portion on the first drain portion 521 using an external pressure process. In one embodiment, in the process of epitaxially forming the source and drain, the source and drain are doped in-situ so that the source and drain have the desired conductivity type. In one embodiment, the epitaxially formed source and drain are doped in-situ by performing an implantation 701 of carbon, fluorine, and/or nitrogen on the source and the drain, as shown in FIG. 7A.

Figure 7B:
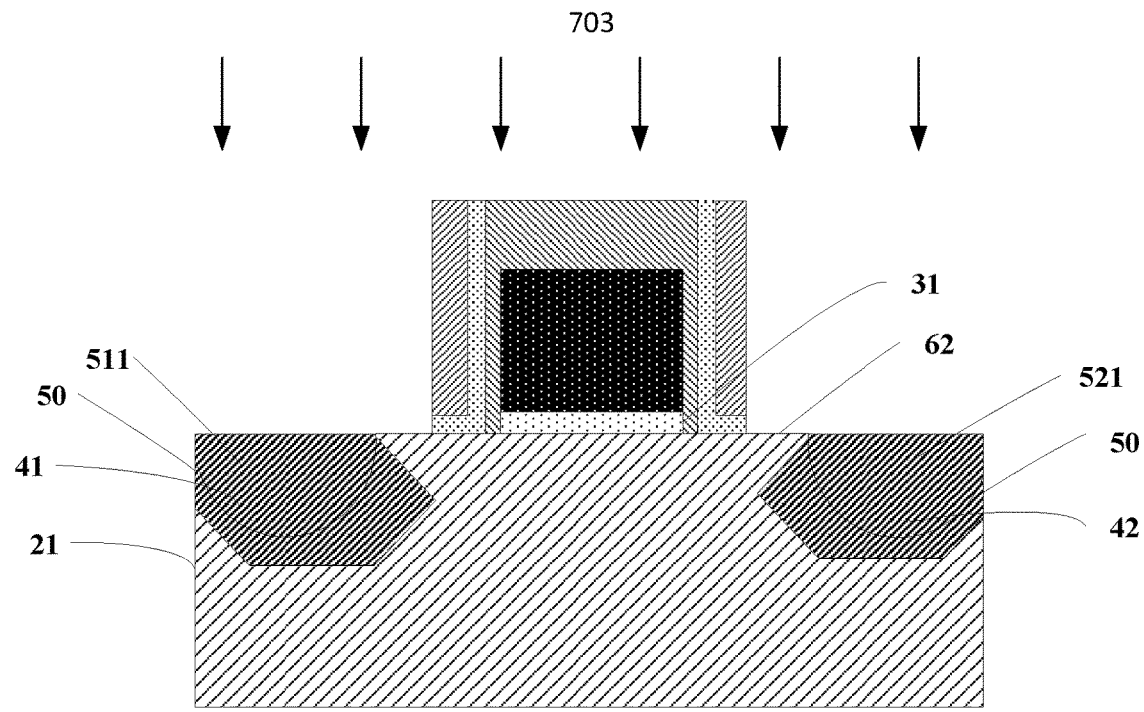
FIG. 7B is a cross-sectional view illustrating an intermediate stage in the process of forming a semiconductor device by performing an implantation after forming the first source portion and the first drain portion in the recesses prior to forming the second source portion and the second drain portion according to one embodiment of the present invention.

In one embodiment, after forming the first source portion and the first drain portion and prior to forming the second source portion and the second drain portion, the step of forming the source and drain may include implanting carbon, fluorine and/or nitrogen in the first source portion and the first drain portion. For example, carbon, fluorine and/or nitrogen may be implanted in the first source portion and the first drain portion in the form of a dopant (e.g., in the form of atoms, molecules, ions, or other elements). FIG. 7B is a cross-sectional view illustrating an intermediate stage in the process of forming a semiconductor device by performing an implantation 703 of carbon, fluorine, and/or nitrogen after forming the first source portion 511 and the first drain portion 521 in the recesses prior to forming the second source portion and the second drain portion according to one embodiment of the present invention. After implanting carbon, fluorine and/or nitrogen, a second source portion and a second drain portion are epitaxially formed on the first source portion and the first drain portion, respectively. In the embodiment, the implantation of carbon, fluorine and/or nitrogen forms a barrier layer in the first source portion and the first drain portion, the barrier layer may block the diffusion of P-type dopants (e.g., boron) or N-type dopants (e.g., phosphorous or arsenic) in the source and drain into the channel region (the channel region is in the semiconductor substrate and between the source and the drain). The barrier layer prevents the P-type dopants or the N-type dopants from being diffused into the channel region, thereby reducing or eliminating any undesired doping of the channel region, preventing the carrier mobility reduction in the channel region, so that a strong cooperating current (i.e., channel current) can be generated in the channel region, the short channel effect can be improved, the leakage current can be reduced, and the semiconductor device performance is improved.

In one embodiment, the dopant concentration of carbon, fluorine, and/or nitrogen in the first source portion and the second first drain portion is in the range between $1 \times 10^{19}$ atoms/cm$^3$ and $1 \times 10^{21}$ atoms/cm$^3$ (e.g., $5 \times 10^{19}$ atoms/cm$^3$, or $1 \times 10^{20}$ atoms/cm$^3$).

In one embodiment, the seed layer 50, the first source portion 511, and the first drain portion 512 each may include silicon germanium. In one embodiment, the first source portion 511 and the first drain portion 521 each have a germanium concentration greater than the germanium concentration of the seed layer 50. By increasing the germanium concentration during the epitaxial forming process of the first source portion and the first drain portion, the stress on the channel region formed between the source and drain is increased, thereby improving the semiconductor device performance.

A method of manufacturing a semiconductor device according to one embodiment of the present invention has been provided. According to the above-described method, a portion of the spacer layer on a sidewall of the gate is thinned using an etch process to expose a portion of the semiconductor substrate. In an example embodiment, the exposed portion of the semiconductor substrate includes a first surface portion and a second surface portion. Next, in the process of forming the source and the drain, the second source portion of the source and the second drain portion of the drain cover the exposed first surface portion and second surface portion of the semiconductor substrate, thereby increasing the contact surface area between the source and drain and the channel region, reducing the contact resistance, increasing the channel current in the operation of the semiconductor device and improving the semiconductor device performance.

In accordance with the above-described manufacturing method, a semiconductor device may also be formed. Referring to FIG. 7, the semiconductor device may include a semiconductor substrate 21, and a gate structure 30 on the semiconductor substrate 21. The gate structure 30 may include a gate dielectric layer 31 on the semiconductor substrate 21, a gate 32 on the gate dielectric layer 31, and a spacer layer 33 on sidewalls on opposite sides of the gate 32. At least one surface portion of the semiconductor substrate 21 adjacent to a side of the spacer layer 33 is exposed. Referring to FIG. 7, a first surface portion 61 and a second surface portion 62 of the semiconductor substrate 21 that are adjacent to the spacer layer 33 on opposite sides of the gate structure 30 adjacent are exposed.

In one embodiment, still referring to FIG. 7, the spacer layer 33 may include a first spacer layer 331 on opposite sidewalls of the gate 32, a second spacer layer 332 on the sidewalls of the first spacer 331 and on a surface of the semiconductor substrate 21, and a third spacer layer 333 on the second spacer layer 332. In one embodiment, the first spacer layer 331 may also be formed covering the upper surface of the gate 32, as shown in FIG. 7.

Referring to FIG. 7, the semiconductor device may further include a first recess 41 and a second recess 42 in the semiconductor substrate 21 on opposite sides of the gate structure 30.

Referring to FIG. 7, the semiconductor device may further include a source 51 filling the first recess 41, and a drain 52 filling the second recess 42. The source 51 may include a first source portion 511 in the first recess 41 and a second source portion 512 on the first source portion 511. The drain 52 may include a first drain portion 521 in the second recess 42 and a second drain portion 522 on the first drain portion 521. At least one of the second source portion 512 and the second drain portion 522 covers at least the exposed surface portion (i.e., first exposed surface portion 61 or second exposed surface portion 62) of the semiconductor substrate 21. For example, as shown in FIG. 7, the second source portion 512 covers the first surface portion 61 and the second drain portion 622 covers the second surface portion 62 of the semiconductor substrate 21.

In the semiconductor device, at least one of the second source portion of the source and the second drain portion of the drain covers at least an exposed surface portion of the semiconductor substrate 21 adjacent to the spacer layer, so as to increase the contact surface area between the source or the drain and the channel region (the channel region in the semiconductor substrate and between the source and the drain), thereby reducing the contact resistance, increasing the channel current during the operation of the semiconductor device to improve the semiconductor device performance.

In the embodiment, the source and the drain each include dopants of a desired conductivity type (e.g., P-type or N-type). In one embodiment, the second source portion 512 has a doping concentration that is greater than the doping concentration of the first source portion 511. The higher doping concentration of the second source portion 512 reduces the contact resistance between the source and the channel region and also the contact resistance between the source and the source contact member (not shown). In one embodiment, the second drain portion 522 has a doping concentration that is greater than the doping concentration of the first drain portion 521. The higher doping concentration of the second drain portion 522 reduces the contact resistance between the drain and the channel region and also the contact resistance between the drain and the drain contact member (not shown).

In one embodiment, the first source portion 511 and the first drain portion 521 each may include silicon germanium, silicon carbide, or silicon phosphide. In one embodiment, the second source portion 512 and the second drain portion 522 each may include silicon.

In one embodiment, still referring to FIG. 7, the semiconductor device may further include a seed layer 50 in the first recess 41 and the second recess 42. The first source portion 511 and the first drain portion 521 are formed on the seed layer 50 in the first recess 41 and the second recess 42, respectively.

In one embodiment, the seed layer 50, the first source portion 511, and the first drain portion 521 each include silicon germanium. In one embodiment, the first source portion 511 and the first drain portion 521 each have a germanium concentration that is greater than the germanium concentration of the seed layer 50.

In one embodiment, the first source portion 511 and the first drain portion 521 each include carbon, fluorine, and/or nitrogen. In one embodiment, the concentration of carbon, fluorine, and/or nitrogen in the first source portion 511 and the first drain portion 521 may be in the range between $1\times10^{19}$ atoms/cm$^3$ and $1\times10^{21}$ atoms/cm$^3$ (e.g., $5\times10^{19}$ atoms/cm$^3$ or $1\times10^{20}$ atoms/cm$^3$).

Figure 8:
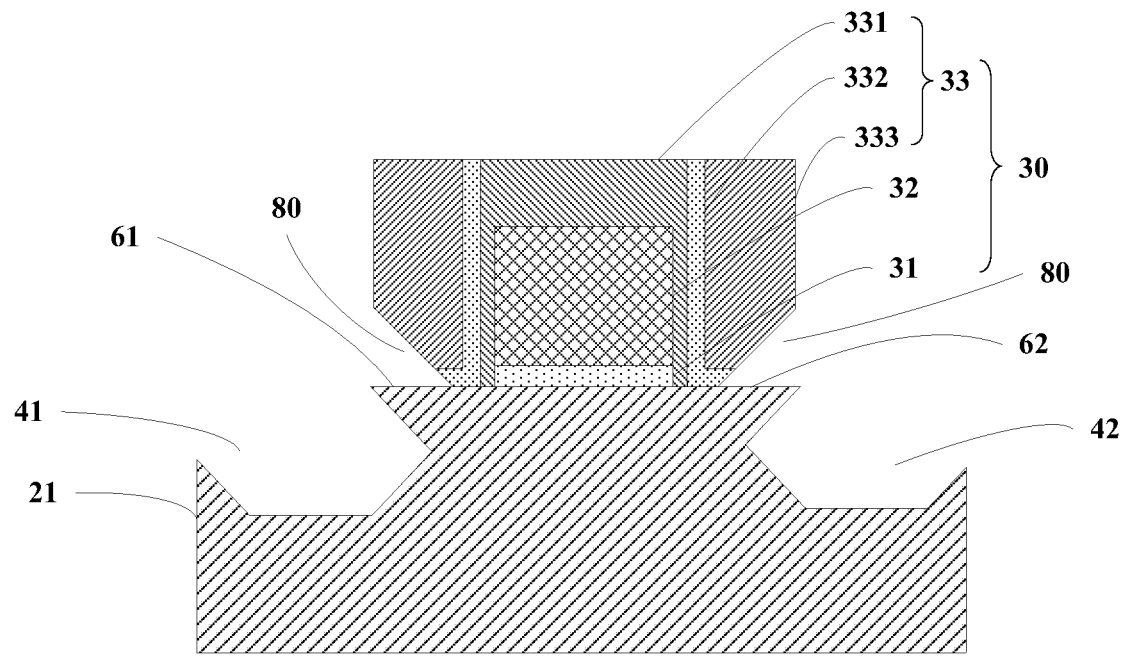
FIG. 8 is a cross-sectional view illustrating an intermediate stage in the process of forming a semiconductor device after forming a notch in the spacer layer according to another embodiment of the present invention.
Figure 9:
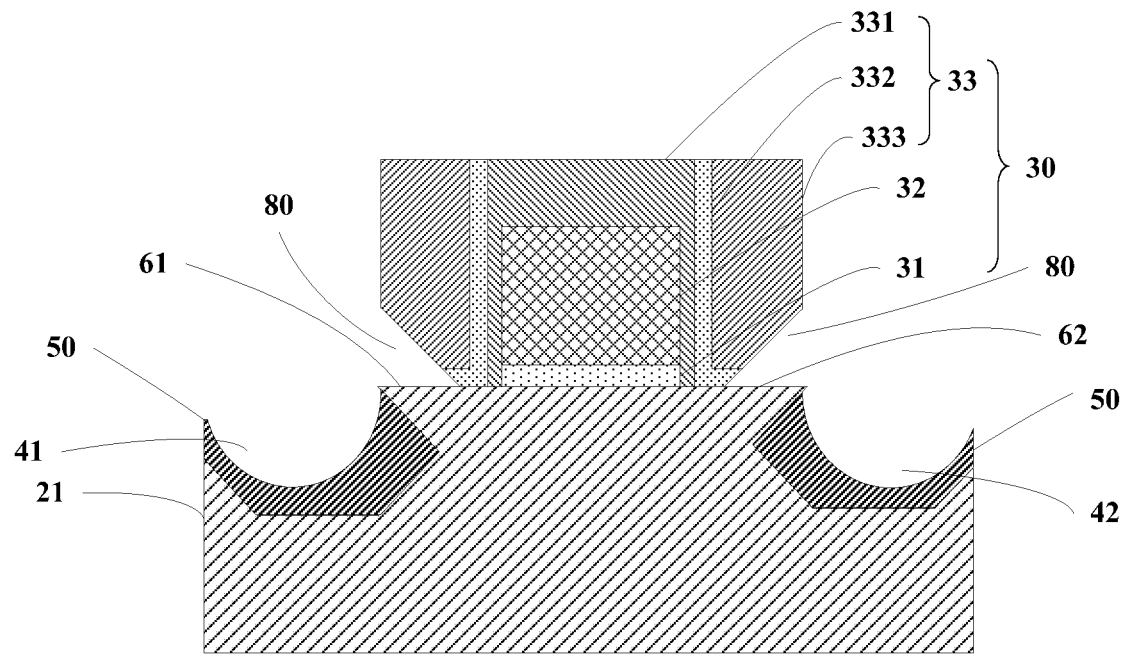
FIG. 9 is a cross-sectional view illustrating an intermediate stage in the process of forming a semiconductor device after forming a seed layer in the recesses according to another embodiment of the present invention.
Figure 10:
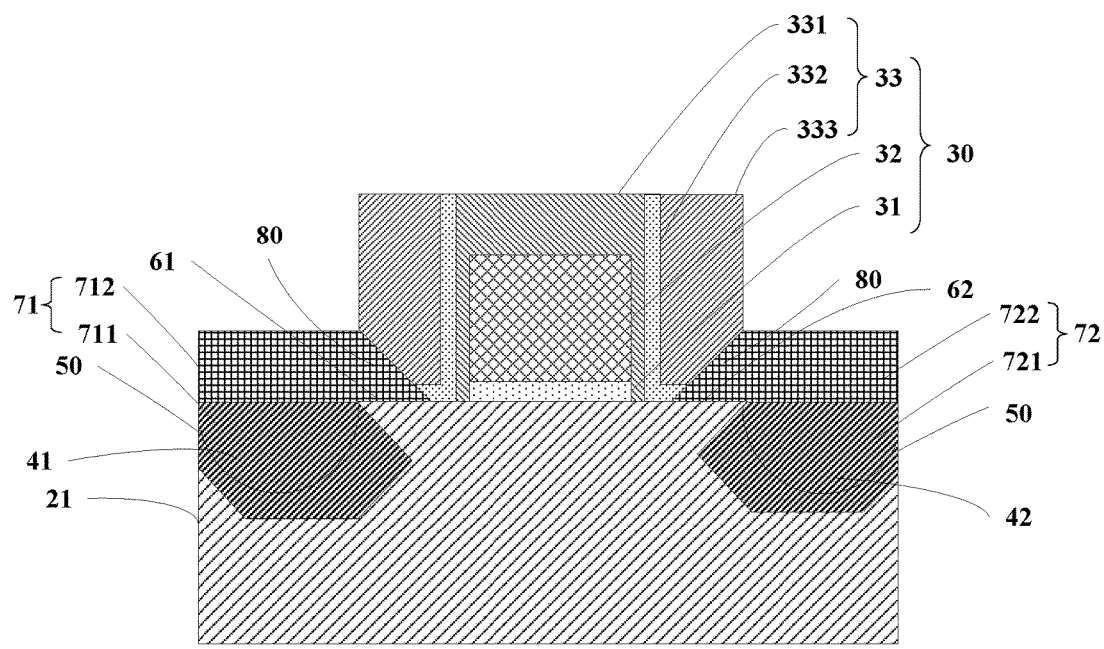
FIG. 10 is a cross-sectional view illustrating an intermediate stage in the process of forming a semiconductor device after forming the source and drain in the recesses according to another embodiment of the present invention.

FIGS. 8 to 10 are cross-sectional views illustrating intermediate stages in a manufacturing method of a semiconductor device according to another embodiment of the present invention. Herein, the stages shown in FIGS. 8 to 10 are after the stages shown in FIGS. 3 and 4. A manufacturing method of a semiconductor device according to another embodiment of the present invention will be described in detail with reference to FIGS. 3 and 4 and FIGS. 8 to 10.

First, a semiconductor structure is provided as shown in FIG. 3. The steps of forming the semiconductor structure shown in FIG. 3 has been described in detail with reference to FIGS. 2 and 3, and will not be repeated herein for the sake of brevity.

Next, referring to FIG. 4, a first etch process is performed on the semiconductor substrate 21 to form a first recess 41 and a second recess 42 on opposite sides of the gate structure 30.

Next, a portion of the spacer layer on at least one side of the gate is removed (e.g., using a second etch process) to expose at least a portion of the semiconductor substrate. In one embodiment, the etch process may include removing a lower portion of the spacer layer to form a notch that exposes at least a surface portion of the semiconductor substrate. Referring to FIG. 8, the second etch process forms a notch 80 in the lower portion of the spacer layer 33 and on opposite sides of the gate. The notch 80 exposes the surface portion 61 and the second surface portion 62 of the semiconductor substrate 21.

It should be noted that, although the process of forming the first recess and the second recess is described herein as performed first in the semiconductor substrate, then followed by the process of forming the notch in the spacer layer, the scope of the present invention is not limited thereto. In other embodiments, the first recess, the second recess, and the notch may be formed concurrently (at the same time). That is, during the process of removing (e.g., by etching) a portion of the semiconductor substrate to form the first recess and the second recess, the process may also removes a portion of the spacer layer to form the notch.

Next, referring to FIG. 9, a seed layer 50 is formed in the first recess 41 and the second recess 42, e.g., using an epitaxial process.

Next, referring to FIG. 10, a source 71 filling the first recess 41 and a drain 72 filling the second recess 42 are formed, e.g., using an epitaxial process. The source 71 may include a first source portion 711 in the first recess 41, and a second source portion 712 on the first source portion 711. The drain 72 may include a first drain portion 721 in the second recess 42, and a second drain portion 722 on the first drain portion 721. The second source portion 712 may cover the first surface portion 61, and the second drain portion 722 may cover the second surface portion 62. The second source portion 712 and the second drain portion 722 also fill the notch 80.

In the embodiment, the source 71 including the first source portion 711 and the second source portion 712 is the same or similar to the source 51 including the respective first source portion 511 and the second source portion 512 of FIG. 7. The description of the source 71 will be omitted herein for the sake of brevity. In addition, the drain 72 including the first drain portion 721 and the second drain portion 722 is the same or similar to the drain 52 including the respective first drain portion 521 and the second drain portion 522 of FIG. 7. The description of the drain 72 will thus be omitted herein.

Thus, a method for manufacturing a semiconductor device has been provided according to another embodiment of the present invention. In the method, a notch is formed (e.g., using an etch process) in the lower portion of the spacer layer that is on at least one side of the gate. The notch exposes at least one surface portion of the semiconductor substrate. In an exemplary embodiment, the at least one surface portion of the semiconductor substrate may include a first surface portion and a second surface portion. Next, in the process of forming the source and the drain, wherein the source includes a second source portion and the drain includes a second drain portion, both of the second source portion and the second drain portion cover the exposed first surface portion and the exposed second surface portion, respectively. The second source portion and the second drain portion increase the contact area between the source and the channel region and the contact area between the drain and the channel region, respectively, thereby reducing the contact resistance and increasing the channel current during the operation of the semiconductor device, so that the performance of the semiconductor device is improved.

A semiconductor device may be manufactured according to the above-described method with reference to FIGS. 8 to 10. Referring to FIG. 10, the semiconductor device may include a semiconductor substrate 21, and a gate structure 30 on the semiconductor substrate 21. The gate structure 30 may include a gate dielectric layer 31 on semiconductor substrate 21, a gate 32 on the gate dielectric layer 31, and a spacer layer 33 on sidewalls on opposite sides of the gate 32. The semiconductor device may include a notch 80 at a lower portion of the spacer layer 33 on the sidewall of at least one side of the gate 32. The notch 80 exposes at least a surface portion of the semiconductor substrate 21. Referring to FIG. 10, a notch 80 is formed in a lower portion of the spacer layer 33 on the sidewall of at least one side of the gate (e.g., on both sides of the gate). The notch 80 exposes at least one surface portion of the semiconductor substrate 21. In one example embodiment, the notch 80 exposes a first surface portion 61 and a second surface portion 62 of the semiconductor substrate 21.

Referring to FIG. 10, the semiconductor device may further include a first recess 41 and a second recess 42 in the semiconductor substrate 21 and on opposite sides of the gate structure 30.

Referring to FIG. 10, the semiconductor device may further include a source 71 filling the first recess 41 and a drain 72 filling the second recess 42. The source 71 may include a first source portion 711 in the first recess 41 and a second source portion 712 on the first source portion 711. The drain 72 may include a first drain portion 721 in the second recess 42 and a second drain portion 722 on the first drain portion 721. The second source portion 712 covers the first surface portion 61 of the semiconductor substrate 21 and fills the notch 80 in one side of the spacer layer, and the second drain portion 722 covers the second surface portion 62 of the semiconductor substrate 21 and fills the notch 80 in the opposite side of the spacer layer.

In the semiconductor device according to an embodiment of the present invention, a notch is formed at a lower portion of the spacer layer and on at least one side of the gate. The notch exposes at least one surface portion of the semiconductor substrate. In one embodiment, at least one surface portion of the semiconductor substrate may include a first surface portion and a second surface portion. The second source portion of the source covers the first surface portion and the second drain portion of the drain covers the second surface portion. The second source portion of the source on the first surface portion increases the contact surface area between the source and channel region, and the second drain portion of the drain on the second surface portion increases the contact surface area between the drain and channel region, so that the contact resistance is reduced, the channel current is increased, and the performance of the semiconductor device is improved.

In some embodiments, after forming the source and the drain, the method may further include performing an ion implantation on the source and the drain to implant carbon, fluorine, and/or nitrogen into the source and the drain. In one embodiment, carbon, fluorine, and/or nitrogen may be implanted in the source and the drain in the form of dopants, which may be, e.g., atoms, molecules, ions, or other elements. In the embodiment, carbon, fluorine, and/or nitrogen that are implanted in the source and the drain may prevent P-type dopants (e.g., boron) or N-type dopants (e.g., phosphorous or arsenic) in the source and the drain from diffusing into the channel region to avoid undesired doping of the channel region that may reduce the carrier mobility in the channel region, so that, during the operation of the semiconductor device, a stronger operating current (e.g., a channel current) can be generated in the channel region, the short channel effect can be improved, the leakage current can be reduced, thereby improving the performance of the semiconductor device.

In one embodiment, the process of implanting carbon, fluorine, and/or nitrogen in the source and the drain may be performed after forming the second source portion and the second rain portion. In one embodiment, in the case where the implantation of carbon, fluorine, and/or nitrogen has not been implanted in the first source portion and the first drain portion in a previous step, carbon, fluorine, and/or nitrogen can be implanted after forming the second source portion and the second rain portion. In another embodiment, in the case where carbon, fluorine, and/or nitrogen have been implanted in the first source portion and the first drain portion in the previous step, carbon, fluorine, and/or nitrogen can be implanted again after forming the second source portion and the second rain portion.

In one embodiment, carbon, fluorine, and/or nitrogen may be implanted into the source and the drain at a depth in the range between 1 nm and 20 nm, e.g., 5 nm or 10 nm. In one embodiment, the dopant concentration of carbon, fluorine, and/or nitrogen in the source and the drain is in the range between $1 \times 10^{19}$ atoms/cm$^3$ and $5 \times 10^{20}$ atoms/cm$^3$ (e.g., $1 \times 10^{20}$ atoms/cm$^3$).

A semiconductor device manufactured by a method according to another embodiment of the present invention may include a source 51 (71) and a drain 52 (72), as shown in FIG. 7 (FIG. 10). In the semiconductor device, the source 51 (71) and the drain 52 (72) each may include carbon, fluorine, and/or nitrogen. In one embodiment, the doping depth of the carbon, fluorine, and/or nitrogen in the source and the drain is in the range between 1 nm and 20 nm (e.g., 5 nm, 10 nm). In one embodiment, the dopant concentration of carbon, fluorine, and/or nitrogen in the source and the drain is in the range between $1 \times 10^{19}$ atoms/cm$^3$ and $5 \times 10^{20}$ atoms/cm$^3$ (e.g., $1 \times 10^{20}$ atoms/cm$^3$).

Figure 11A:
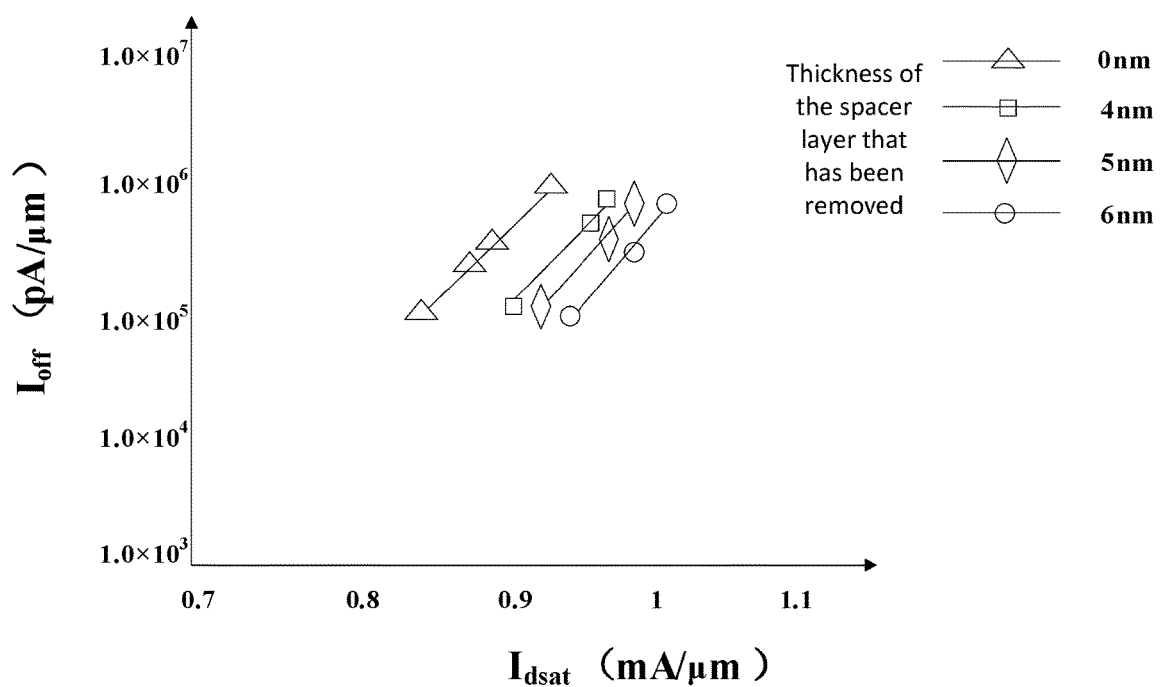
FIG. 11A is a graph illustrating the relationship between the drain current Ioff and the operating current Idsat of a semiconductor device that is formed after the spacers are cut to different thicknesses.

FIG. 11A is a graph diagram illustrating the relationship between a leakage current Ioff and the operating current Idset of a semiconductor device as a function of different thicknesses of a spacer layer that have been removed. FIG. 11A is a graph diagram illustrating the relationship between the operating current Idsat and the operating voltage Vtsat of a semiconductor device as a function of different thicknesses of a spacer layer that have been removed. The different thicknesses removed from the spacer layer reflect the surface area of the exposed surface portion of the semiconductor substrate. That is, the surface area of the first surface portion and the second surface portion that is covered by the respective second source portion and the second drain portion. The greater the removed thickness of the spacer layer, the greater the surface area of the exposed surface portion of the semiconductor substrate covered by the source and/or drain. In other words, the greater the thickness of the spacer layer that is removed, the larger the contact area between the source and the channel region (and between the drain and the channel region).

Referring to FIG. 11A, the greater the thickness of the spacer layer is removed, the smaller the leakage current Ioff is at the same operating current Idsat (i.e., the channel current), reflecting a better semiconductor device performance.

Figure 11B:
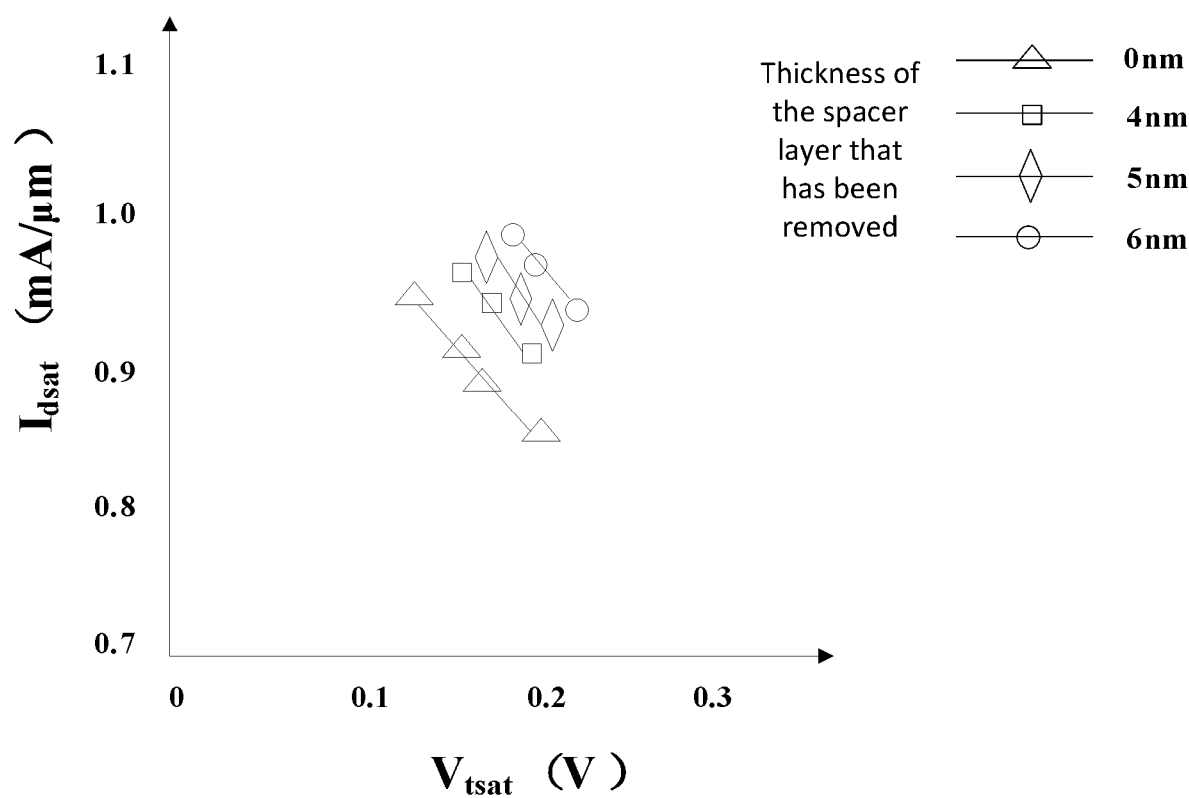
FIG. 11B is a graph illustrating the relationship between the operating current Idsat and the operating voltage Vtsat of a semiconductor device that is formed after the spacers are cut to different thicknesses.

Referring to FIG. 11B, the greater the thickness of the spacer layer is removed, the larger the operating current Idsat (i.e., the channel current) at the same operating voltage Vtsat, reflecting a better semiconductor device performance Thus, embodiments of the present disclosure provide a detailed description of a semiconductor device and method of manufacturing the semiconductor device. Details of well-known processes are omitted in order not to obscure the concepts presented herein.

It is to be understood that the above described embodiments are intended to be illustrative and not restrictive. Many embodiments will be apparent to those of skill in the art upon reviewing the above description. The scope of the disclosure should, therefore, be determined not with reference to the above description, but instead should be determined with reference to the appended claims along with their full scope of equivalents.

What is claimed is:

1. A method for manufacturing a semiconductor device, comprising:
    providing a semiconductor structure including a semiconductor substrate and a gate structure on the semiconductor substrate, the gate structure including a gate dielectric layer on the semiconductor substrate, a gate on the gate dielectric layer, and a spacer layer on opposite sides and on an upper surface of the gate;
    etching the semiconductor substrate to form a first recess and a second recess on opposite sides of the gate structure;
    etching a portion of a sidewall of the spacer layer on at least one side of the gate to expose a surface portion of the semiconductor substrate; and forming a source by filling the first recess and forming a drain by filling the second recess, the source comprising a first source portion in the first recess and a second source portion on the first source portion, the drain comprising a first drain portion in the second recess and a second drain portion on the first drain portion, wherein the second source portion or the second drain portion covers the exposed surface portion of the semiconductor substrate, wherein the spacer layer comprises:

a first spacer layer having a first portion on the opposite sides of the gate and a second portion on the upper surface of the gate, the second portion having a thickness greater than a thickness of the first portion;

a second spacer layer on the first portion of the first spacer layer; and a third spacer layer on sidewalls of the second spacer layer.

2. The method of claim 1, wherein etching the portion of the sidewall of the spacer layer comprises:

etching a lower portion of the spacer layer on the opposite sides of the gate to expose a first surface portion of the semiconductor substrate and a second surface portion of the semiconductor substrate, the first surface portion being adjacent to the first recess, and the second surface portion being adjacent to the second recess; and forming the source comprises forming the second source portion on the first surface portion, and forming the drain comprises forming the second drain portion on the second surface portion.

3. The method of claim 1, wherein etching the portion of the sidewall of the spacer layer comprises:

removing a thickness of the sidewall of the spacer layer to expose the surface portion of the semiconductor substrate.

4. The method of claim 1, wherein etching the portion of the sidewall of the spacer layer comprises:

forming a notch in a lower portion of the spacer layer, the notch exposing the surface portion of the semiconductor substrate.

5. The method of claim 1, wherein:

the second source portion has a doping concentration greater than a doping concentration of the first source portion;

the second drain portion has a doping concentration greater than a doping concentration of the first drain portion.

6. The method of claim 1, wherein:

the first source portion and the first drain portion each comprise silicon germanium, silicon carbide, or silicon phosphide;

the second source portion and the second drain portion each comprise silicon.

7. The method of claim 1, further comprising, prior to forming the source and forming the drain: forming a seed layer in the first recess and in the second recess.

8. The method of claim 7, wherein the seed layer, the first source portion, and the first drain portion each comprise silicon germanium, and the first source portion and the first drain portion each comprise a germanium concentration that is greater than a germanium concentration of the seed layer.

9. The method of claim 7, further comprising, after forming the first source portion and the first drain portion and prior to forming the second source portion and the second drain portion: performing an implantation of carbon, fluorine, and/or nitrogen in the first source portion and the first drain portion.

10. The method of claim 1, further comprising, after forming the source and forming the drain: performing an implantation of carbon, fluorine, and/or nitrogen on the source and the drain.

11. The method of claim 10, wherein the carbon, fluorine, and/or nitrogen are implanted in the source and the drain at a depth in a range between 1 nm and 20 nm and a concentration in a range between $1\times10^{19}$ atoms/cm$^3$ and $5\times10^{20}$ atoms/cm$^3$.

12. The method of claim 7, wherein forming the seed layer comprises an epitaxial process.

13. The method of claim 9, wherein a concentration of the carbon, fluorine, and/or nitrogen is in a range between $1\times10^{19}$ atoms/cm$^3$ and $1\times10^{21}$ atoms/cm$^3$.

14. The method of claim 1, wherein forming the second source portion on the first source portion and forming the second drain portion on the first drain portion comprise an epitaxially forming process.

15. The method of claim 1, wherein:

the first spacer layer comprises silicon nitride;

the second spacer layer comprises silicon dioxide; and the third spacer layer comprises silicon nitride.

* * * * *